US005500617A

United States Patent [19]

Tsugita

[11] Patent Number: 5,500,617

[45] Date of Patent: Mar. 19, 1996

[54] CLAMPING CIRCUIT FOR ADJUSTING A LEVEL OF A TRANSMITTED SIGNAL AT A PREDETERMINED VOLTAGE

[75] Inventor: Masami Tsugita, Tokyo, Japan

[73] Assignee: NEC Corporation, Tokyo, Japan

[21] Appl. No.: 269,132

[22] Filed: Jun. 30, 1994

[30] Foreign Application Priority Data

Jun. 30, 1993 [JP] Japan .................................. 5-183391

[51] Int. Cl.[6] .............................. H03G 11/00; H03K 5/08

[52] U.S. Cl. .......................... 327/321; 327/327; 327/563

[58] Field of Search ................................ 327/52, 53, 54, 327/65, 66, 67, 309, 312, 316, 321, 563, 327

[56] References Cited

U.S. PATENT DOCUMENTS

| | | | |
|---|---|---|---|
| 4,277,703 | 7/1981 | Wada et al. | 327/321 |
| 4,367,441 | 1/1983 | Niyada et al. | 327/321 |
| 4,634,890 | 1/1987 | Lee | 327/312 |
| 4,644,198 | 2/1987 | Ahmed | 327/321 |
| 4,897,560 | 1/1990 | Saito et al. | 327/321 |
| 4,984,207 | 1/1991 | Tateno et al. | 327/52 |
| 5,021,682 | 6/1991 | Hobrecht | 327/563 |
| 5,061,862 | 10/1991 | Tamagawa | 327/563 |
| 5,280,200 | 1/1994 | Tarng | 327/316 |

FOREIGN PATENT DOCUMENTS 50-152655 5/1974 Japan .

*Primary Examiner*—Timothy P. Callahan
*Assistant Examiner*—My-Trang Nu Ton
*Attorney, Agent, or Firm*—Foley & Lardner

[57] ABSTRACT

A clamping circuit has a differential amplifier having a pair of transistors for comparing a voltage of an output node and a constant clamp voltage. The pair of transistors has a common emitter node supplied with a constant current from a first current source. An output of the differential amplifier is supplied to a base of a transistor for charging the output node. The output node is discharged constantly by a second current source. The constant current from the first current source is twice as large as the constant current from the second current source. The first and second current sources are controlled and activated to generate the first and second currents according to a current control signal. The clamping circuit also has a current control circuit for setting a value of each of the first and the second constant currents. The current control circuit is controlled by a clamp control signal and selectively activates the circuit and second current sources.

10 Claims, 4 Drawing Sheets

CL3 CL2 CL1 309 308 6 307 1 2 C3 C2 C1 $V_{cl}$ $V_{cc}$ 3 R301 R302 Q302 R303 Q301 Scl Q309 N1 Q303 Q304 Q307 Q305 X2 R319 I R310 2I Q308 Q306 Q312 Q311 R308 Q310 X2 X2 R309 R307 R306 R305 R304 4 5 L3 IS12 L2 IS11 L1 IS10 IC10

IC1
IS1
Scl
$V_{cl}$
$V_{cc}$
4GND
Q1
Q2
Q3
Q4
Q5
Q6
Q7
Q8
Q9
Q10
Q11
Q12
Q13
Q14
Q15
R1
R2
R3
R4
R5
R6
R7
R8
R9
R10
R11
R12
R13
R14
N1
N2
C1
C2
C3
L1
L2
L3

1
2
3
4
5
6
Vcl
Vcc
Scl
Q305
Q306
Q307
R319
Q308
Q309
Q310
X2
R304
R305
R306
IC10
Q304
R302
Q302
R303
R308
R307
I2I
Q311
IS10
307
CL1
R301
Q301
Q303
R310
Q312
R309
I1
N1
C1
L1
CL2
308
C2
IS11
L2
CL3
309
C3
IS12
L3

CLAMPING CIRCUIT FOR ADJUSTING A LEVEL OF A TRANSMITTED SIGNAL AT A PREDETERMINED VOLTAGE

BACKGROUND OF THE INVENTION

The present invention relates to a clamping circuit and, more particularly, to a clamping circuit coupled with a signal line and clamping and adjusting a level of a transmitted signal at a predetermined voltage.

A conventional clamping circuit for clamping a voltage level of a clamp output node connected to a signal line has a detecting stage for detecting a voltage at the clamp output node and a feedback stage having a first and second feedback path for charging or discharging the node, respectively, according to the detected voltage. The detecting stage is usually constructed by using a differential amplifier having one input node connected to the clamp output node and another connected to a reference voltage terminal. One output of the differential amplifier controls a gate circuit which constitutes the first feedback path for supplying a current from a power supply terminal to the clamp output node. Another output of the differential amplifier selectively activates the second feedback path having current mirror circuit. That is, the current mirror circuits is supplied with an input current thereof by the differential amplifier and, accordingly, pulls a current from the clamp output node and provides it to a ground terminal. The clamping circuit also has a current source section responsive to a clamp control signal for supplying a constant current to the differential amplifier. Therefore, the activation of the clamping circuit is controlled by the clamp control circuit.

An example of conventional clamping circuit coupled with a signal line is shown in FIG. 1. A clamping circuit having a clamping section 7 and a current source IS1 is connected to a signal line L1. In FIG. 1, other clamping circuits each having clamping section 8 or 9 are also coupled with signal lines L2 and L3 to provide a three channel signal transmitting circuit. As for the signal line L1, for example, it has an output terminal 5 which is directly connected to a clamp output node N1 of the clamping section 7 and connected to an input terminal 6 via a capacitor C1. To the input terminal 6, an analog signal to be transmitted is supplied. The signal is, for example, a composite video signal having horizontal scan periods and blanking periods appearing alternately. In this case, the signal lines L1, L2 and L3 correspond to three primary colors respectively.

In the clamping section 7, transistor Q3 having its base electrode to the clamp output node N1 and transistor Q4 having its base to a clamp voltage terminal 2 supplying a clamp voltage Vcl are coupled to each other to form a differential amplifier. The emitter electrodes of the transistor Q3 and Q4 are commonly connected to a transistor Q13 in a current source section IS1 which is controlled by a current control section IC1. The current control circuit IC1 is supplied with a clamp control signal Scl from a clamp control terminal 1 and activates the current source section IS1 when the clamp control signal Scl is at High level. That is, the clamping circuit shown in FIG. 1 is selectively activated to clamp a voltage of the node N1 by the clamp control signal Scl.

The collector electrode of the transistor Q4 is connected to a base electrode of a transistor Q5. When the voltage at the node N1 is lower than the clamp voltage Vcl, the collector voltage of the transistor Q4 falls and the pnp-type transistor Q5 increases a current from a power terminal Vcc to the clamp output node N1, thereby increasing the voltage of the node N1. The collector electrode of the transistor Q3 is connected to collector and base electrodes of a transistor Q2.

When the voltage at the node N1 is higher than the clamp voltage Vcl, the transistor Q3 increases base and collector currents of the transistor Q2. A transistor Q1 in combination with the transistor Q2 forms a current mirror circuit and also increases its output current from the power terminal 3 to a node N2. The increased current to the node N2 is supplied to a transistor Q8 and flows to the ground terminal 4. A transistor Q7 in combination with the transistor Q8 forms another current mirror circuit and increases its collector current from the clamp output node N1 to the ground terminal 4, decreasing the voltage of the node N1. Therefore the clamping circuit clamps and maintains the voltage of the node N1 at the predetermined clamp voltage Vcl. When the clamp control signal Scl is at Low level, the transistors Q5 and Q7 are supplied with no base currents and, therefore, are in nonconductive states. The transistor Q3 is also in nonconductive state and no base current flows through the transistor Q3. Therefore, the voltage of the node N1 is maintained at the clamp voltage Vcl.

When the voltage of the node N1 is equal to the clamp voltage Vcl, the transistors Q3 and Q4 are conductive and provide base currents of the transistors Q1, Q2, Q5 and Q6. The transistor Q1 provides base currents of the transistors Q7 and Q8. Therefore, in this case, each of the transistors Q1 to Q8 allow its collector current to flow stably. That is, the collector currents of the transistors Q3, Q4, Q7 and Q8 are provided to the ground terminal 4 stably.

In this case, the operation of the clamping circuit for clamping the voltage of the node N1 is performed during the blanking interval of the composite video signal supplied to the input terminal 6. That is, the clamp control signal Scl is synchronized with the composite video signal in such a manner that the control signal Scl takes its High level during the blanking interval of the video signal. During the blanking period, the video signal supplied to the input terminal 6 takes, for example, its maximum voltage level Vmax. At the same time, the clamping circuit clamps the voltage of the node N1 at the clamp voltage Vcl. Therefore the capacitor C1 is charged according to a voltage difference between the maximum voltage level Vmax and the clamp voltage Vcl. When the blanking period is over and the following horizontal scan periods starts, the node N1 in the clamping section 7 is rendered to be in a floating state. Therefore, the voltage level of the input video signal supplied to the input terminal 6 is shifted as a whole to have its maximum voltage exactly equal to the clamp voltage Vcl and transmitted to the output terminal 5.

However, in the conventional clamping circuit, the clamping section 7 necessitates current mirror circuits for constituting a feedback path to discharge the clamp output node N1 and causes increase in number of circuit elements or total circuit area. Moreover, owing to the current mirror circuits, the feedback operation takes a long time and decreases the operation speed of the clamping circuit. Furthermore, owing to the current mirror circuits, in particular to those having the transistors Q7 and Q8, which makes stable currents to the ground terminal, the current consumption of the clamping circuit becomes very large. The feed back operation taking a long time also causes a large current consumption at the current source section IS1 and the current mirror circuit having the transistors Q7 and Q8. In particular, in case where the clamping circuit is applied to a signal transmitting circuit and coupled with a signal line for transmitting a composite video signal, the conventional clamping circuit necessitates a long blanking period and decreases the total operation speed of the signal transmitting circuit.

SUMMARY OF THE INVENTION

Therefore, an object of the present invention is to provide a clamping circuit having a simplified circuit construction and operating at a high speed.

Another object of the invention is to provide a clamping circuit having small current consumption.

A clamping circuit according to the invention has a first current source for pulling a current from a clamp output node constantly, a detecting stage for detecting a voltage of a clamp output node and a driving stage responsive to an output of the detecting stage for supplying a current to the clamp output node with a driving capability controlled by the output of the detecting stage.

The detecting stage has a differential pair of transistors having emitter electrodes connected commonly to a second current source which has twice the capability of the first current source.

Each of the first and second current sources comprises a transistor having its base electrode isolated from each other and independently controlled by a current control circuit.

BRIEF DESCRIPTION OF THE DRAWINGS

The above mentioned and other objects, advantages and features of the present invention will become more apparent from the following detailed description taken in conjunction with the accompanying drawings, in which.

DETAILED DESCRIPTION OF PREFERRED EMBODIMENTS

Figure 3:
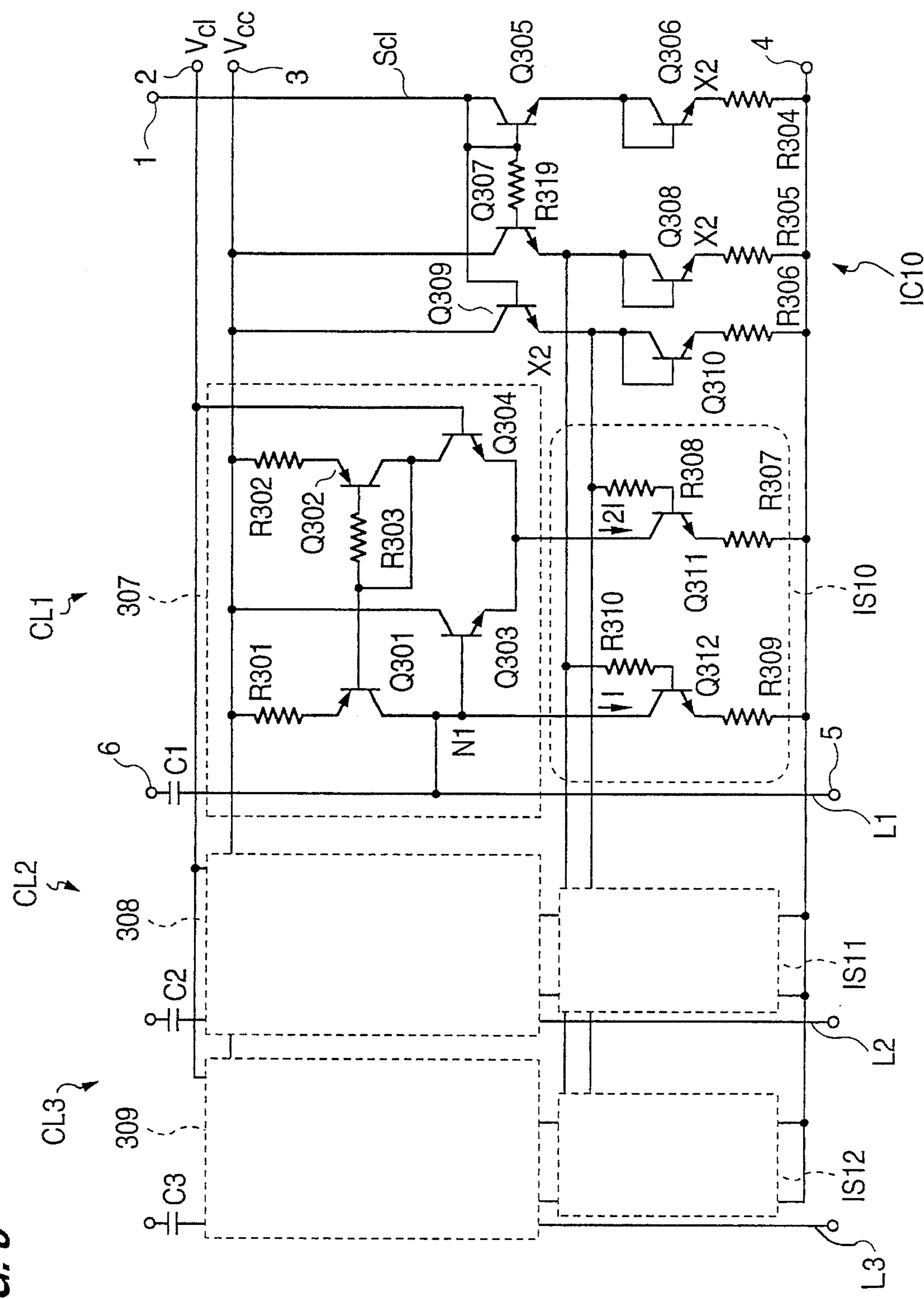
FIG. 3 is a circuit configuration of a clamping circuit according to a embodiment of the present invention.

In FIG. 3, clamping circuits CL1, CL2 and CL3 are coupled with signal lines L1, L2 and L3 respectively for clamping a level of a transmitted signal. The clamping circuit CL1 has a clamping section 307 and a current source section IS10. Other clamping circuit CL2 and CL3 have the same construction as the circuit CL1. The current source sections IS10, IS11 and IS12 of the clamping circuits CL1, CL2 and CL3 are commonly connected to a current control section IC10. The current control circuit IC10 is activated according to a clamp control signal Scl from a clamp control terminal 1. Therefore the clamping circuits CL1, CL2 and CL3 perform the clamping operation when the clamp control signal Scl is at High level.

As shown in FIG. 3, when the current control circuit IC10 activates the current source section IS10, a current source transistor Q311 supplies a current having an amount of 2I to emitter electrodes of transistors Q303 and Q304. The transistors Q303 and Q304 have emitter electrodes connected to each other and form a differential amplifier. A base and a collector of the transistor Q304 are respectively connected to a clamp voltage terminal 2 and to one terminal of a current mirror circuit comprised of transistors Q301 and Q302 and resistors R301, R302 and R302. On the other hand, a current source transistor Q312 supplies a current having an amount of I, a half of the current from the transistor Q311, to a clamp output node N1. The node N1 is also connected to a collector of the transistor Q301 and a base of the transistor Q303.

That is, when the clamp control signal Scl is at High, the differential amplifier having transistors Q303 and Q304 operates to compare the voltage of the node N1 with the clamp voltage Vcl. The transistor Q304 output its collector current in an amount defined by the voltage difference between the voltage of the node N1 and the clamp voltage Vcl. The collector current from the transistor Q304 are supplied to the current mirror circuit having the transistors Q301 and Q302 and defines an amount of a collector current from the transistor Q301. Therefore, the transistor Q301 supplies the collector current to the node N1 whereas the transistor Q312 pulls the constant current from the node N1. The difference obtained by subtracting the constant current from the collector current of the transistor Q301 is, if any, supplied to the base of the transistor Q303.

In detail, when the voltage level of the clamp output node N1 is equal to the clamp voltage Vcl, the constant current in the amount of 2I from the transistor Q308 is divided equally and supplied to the transistors Q303 and Q304 as their emitter currents. Therefore, the collector current of the transistor Q302 becomes I, which is generated by the transistor Q301 as an output current of the current mirror circuit having the transistors Q301 and Q302. The node N1 is supplied with the current I from the transistor Q301. That is, the transistor Q301 drives the voltage of the node N1. At the same time, the transistor Q312 pulls the constant current I from the node N1. Accordingly, the voltage level of the node N1 is maintained stably.

When the voltage of the node N1 is lower than the clamp voltage Vcl, the transistors Q303 and Q304 divide the constant current 2I from the transistor Q308 and respectively output collector currents IQ3 and IQ4, wherein IQ3(≡I-dI)<I <(I+dI≡)IQ4. The collector current of the transistor Q301 also becomes at I+dI whereas the collector current of the transistor Q312 is at I. Therefore, the node N1 is charged and raises its voltage level untill it becomes equal to the clamp voltage Vcl. When the voltage of the node N1 is higher than the clamp voltage Vcl, the collector current of the transistor Q304 is decreased and also the collector current of the transistor Q301 is decreased. Therefore, the node N1 is discharged by the transistor Q312 and decrease its voltage until it becomes equal to the clamp voltage Vcl.

Figure 1:
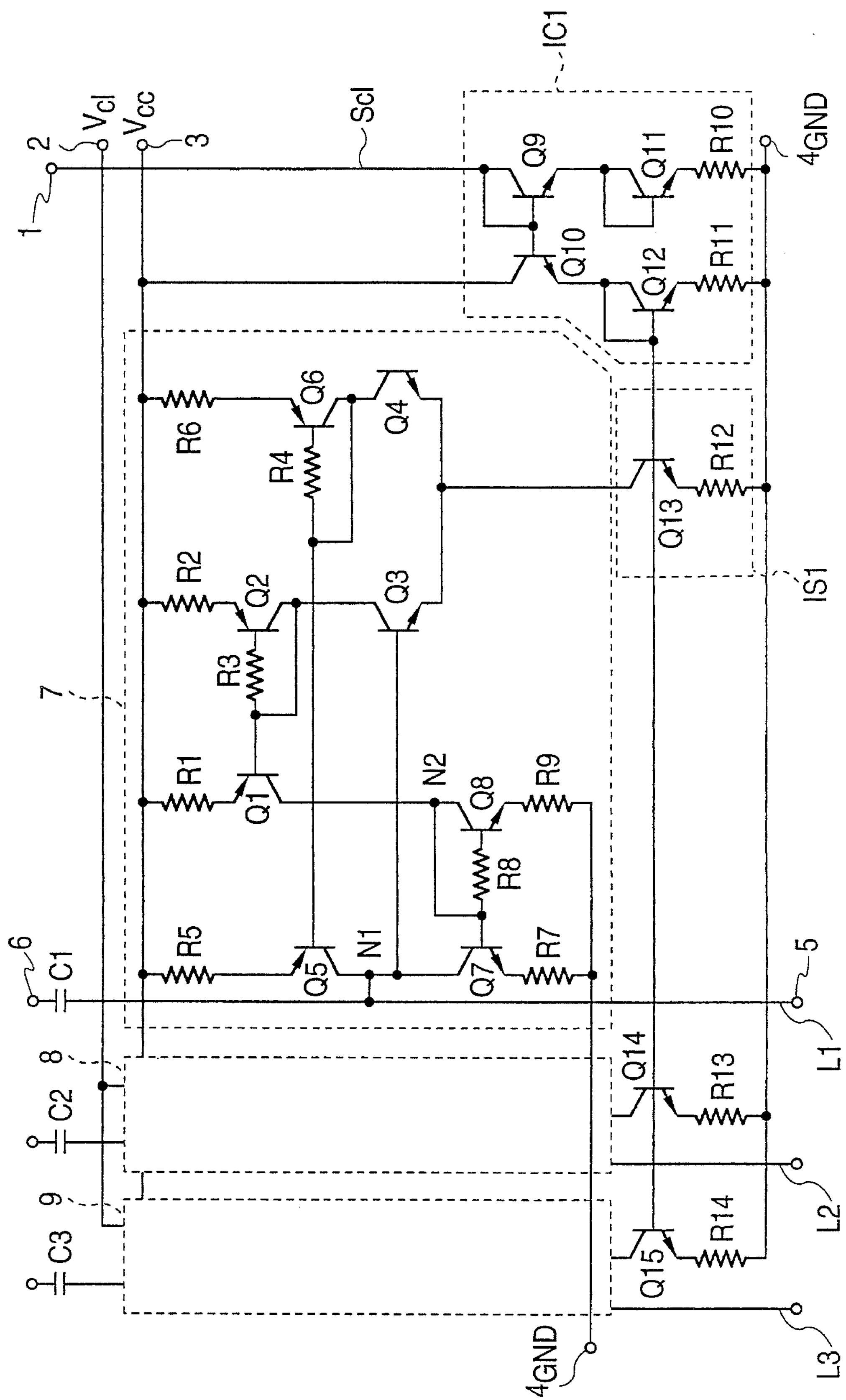
FIG. 1 is has circuit constitution of a conventional clamping circuit.

Therefore, in the clamping circuit according to the present invention, although the number of transistors in the current source section IS10 and the current control section IC10 is increased from that of the circuit in FIG. 1, the construction in the clamping section 307 is considerably decreased and the total construction of the clamping circuit CL1 or the signal transmitting circuit in FIG. 3 is highly simplified. In particular when the clamping circuit of the invention is applied to a multi channel signal transmitting circuit having more channels, since the construction of the clamping circuit CL1 is simplified, the simplification of whole circuit occurs more apparently and effectively.

Moreover, in the clamping circuit of the invention, stable currents flow to the ground terminal 4 through the only two transistors Q308 and Q312, the former is to activate the detecting stage and the later is to discharge the clamp output node N1. Therefore the current consumption is decreased in comparison with the conventional circuit shown in FIG. 1, wherein the current mirror transistor Q8 generates a stable current in addition to the two transistors Q13 and Q7 for activating the detecting stage and discharging the node N1.

Furthermore, since the circuit of the invention eliminates current mirror circuits from the feedback path for discharging the output node N1, the operation speed of this circuit is improved. Then the clamping circuit of the invention is applicable to a high speed video signal transmitting circuit.

Figure 2:
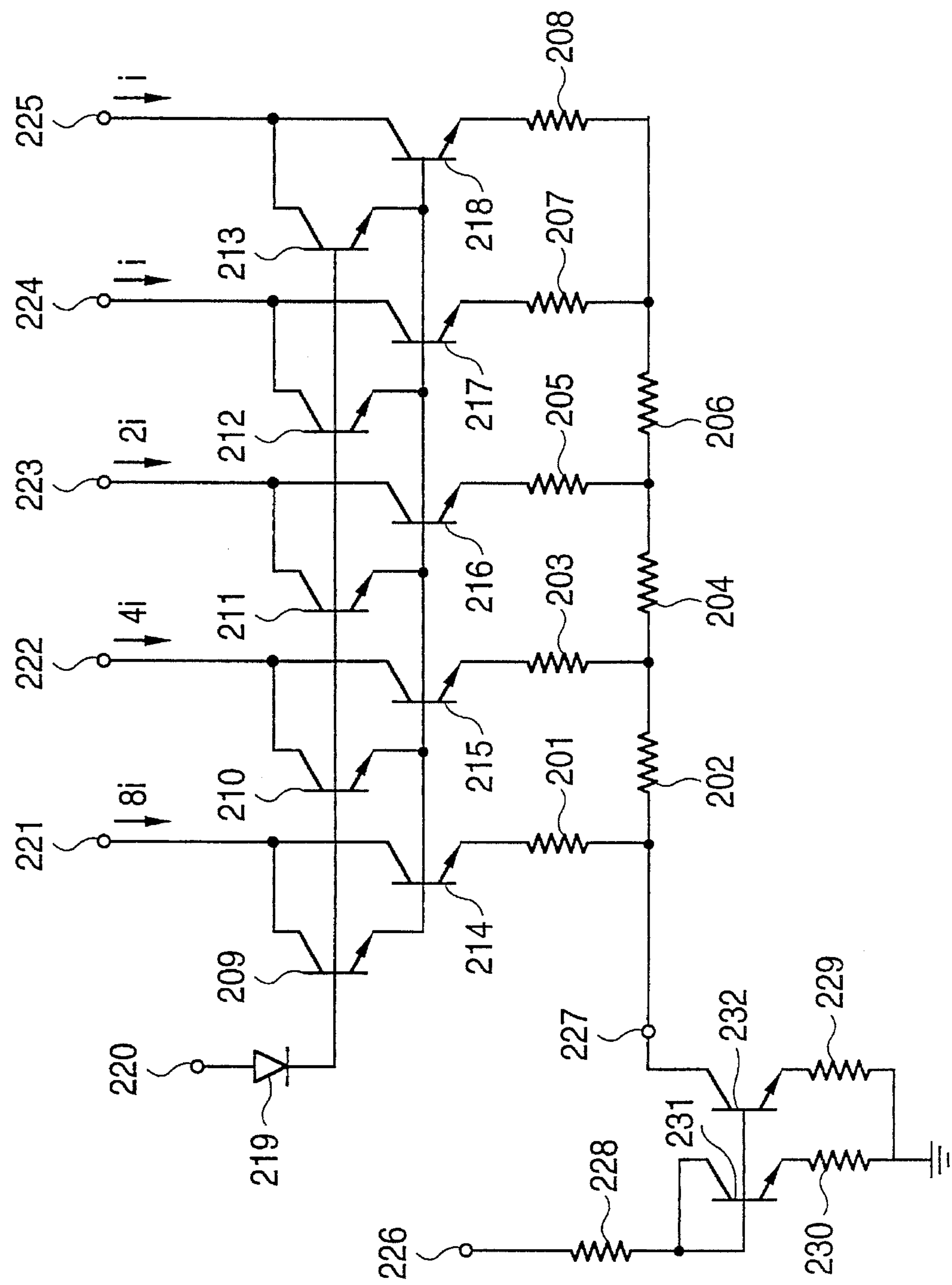
FIG. 2 is a conventional current source circuit.
Figure 4:
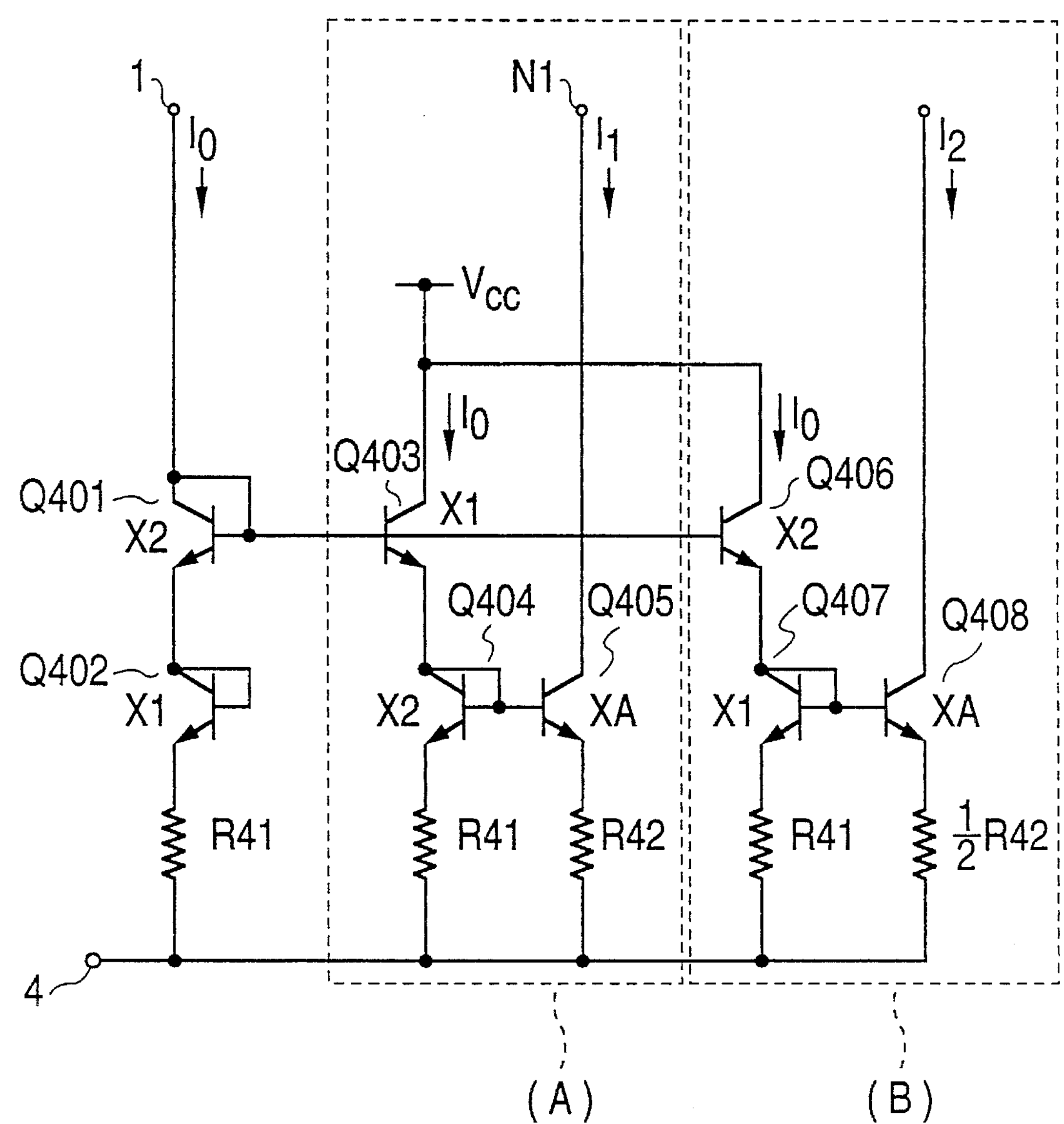
FIG. 4 is a circuit configuration of current source and current control circuits in FIG. 3.

The circuit in FIG. 3 also improves an accuracy in clamping and setting the voltage of the node N1 at the predetermined clamp voltage Vcl by using a current source circuit shown in FIG. 4 which has high reliability in setting the two constant currents I and 2I. The properties of the circuit of FIG. 4 are such that the output currents I and 2I are determined accurately, or the circuit area is small. The properties of the circuit of FIG. 4 become more apparent from comparison with a conventional current source circuit for outputting a plural constant current shown in FIG. 2, which is disclosed in Japanese Patent Application Laid Open No.: 50-152655. The conventional circuit in FIG. 2 utilizes resistors for setting output currents and, in order to decrease the variation in the output current owing to variations in the resistors, utilizes darlington type biassing to the bases of the output transistors. Therefore the circuit of FIG. 2 deteriorates in its accuracy in setting current value and necessitates a large area.

FIG. 4 is a circuit construction of the current source IS10 and the current control circuit IC10, wherein the construction is re-drawn to simplify the explanation. The signs such as x1, x2 and xA associated with the transistors in FIG. 4 represent relative emitter areas of each of the transistors. The circuit sections A and B in FIG. 4 respectively generate the constant currents I and 2I. As for the transistors Q404 and Q405, the base voltage thereof are equal to each other. Then the following equation (1) stands:

$$I0 \times R41 + Vt \times log(I0/(2 \times Is1)) = I1 \times R42 + Vt \times log(I1/(A \times Is2)) \quad (1),$$

wherein the signs Is1 and Is2 represent respectively saturation currents of the transistors Q404 and Q405, Vt represents a thermal voltage kT/q.

As in the same manner concerning the transistors Q407 and Q408, the following equation (2) stands:

$$I0 \times R41 + Vt \times log(I0/Is1) = I2 \times R42/2 + Vt \times log(I2/(A \times Is2)) \quad (2),$$

Assuming that I2 in the equation (2) is equal to 2×I1, it leads to the third equation (3):

$$I0 \times R41 + Vt \times log(I0/Is1) = I1 \times R42 + Vt \times log(I1/(A \times Is2)) + Vt \times log2 \quad (3),$$

hence:

$$I0 \times R41 + Vt \times log(I0/(2 \times \times Is1)) = I1 \times R42 + Vt \times log(I1/(A \times Is2)) \quad (4),$$

The equation (4) is identical to the equation (1). Therefore, the collector current I2 of the transistor Q408 is set at twice as large as the collector current I1 of the transistor Q405 accurately.

In this case, as shown in FIG. 3, the transistors Q406 and Q404 having a twice as large emitter area, which is equivalent to the transistors Q306 and Q309, are utilized in the current control circuit IC10 and connected to each of the current source sections IS10, IS11 and IS12. Therefore the large area for forming such large transistors are necessitated in only the common current control circuit IC10.

The ratio in currents from the transistors Q311 and Q312, which is 1:2, can be modified by varying and adjusting the transistor sizes or resistances of the transistors and resistors in the clamping section 307.

Although the present invention has been described with reference to a specific embodiment, this description is not meant to be construed in a limiting sense. Various modifications of the disclosed embodiment, as well as other embodiments of the present invention, will become apparent to persons skilled in the art upon reference to the description of the present invention. It is, therefore, contemplated that the appended claims will cover any modifications or embodiments as fall within the true scope of the present invention.

What is claimed is:

1. A clamping circuit, comprising:

an input terminal supplied with an input voltage signal;

an output terminal for outputting an output voltage signal;

transfer means coupled between said input and output terminals for transferring said input voltage signal to said output terminal;

a clamp voltage terminal supplied with a clamp voltage;

a clamping section coupled to said output terminal and said clamp voltage terminal and, when activated, forming a first current path between said output terminal and a first power supply line, said first current path having a first current capability responsive to a difference between a voltage at said output terminal and said clamp voltage; and a current control section coupled between said output terminal and a second power supply line and, when activated, forming a second current path therebetween, said second current path having a second current capability that is substantially constant and independent of said difference;

wherein said output voltage signal at said output terminal is clamped to said clamp voltage when said clamping section and said current control section are activated, and said output voltage signal is changed in accordance with said input voltage signal when said clamping section and said current control section are deactivated.

2. The clamping circuit as claimed in claim 1, wherein said transfer means comprises a capacitor.

3. The clamping circuit as claimed in claim 1, wherein said clamping section includes a first transistor coupled between said output terminal and said first power supply line and first driving means for driving said first transistor with said difference, and said current control section includes a second transistor coupled between said output terminal and said second power supply line and second driving means for driving said second transistor with a constant voltage.

4. The clamping circuit as claimed in claim 3, wherein said first driving means includes a differential amplifier having a first input node coupled to said output terminal, a second input node coupled to said clamp terminal and an output node coupled to a control electrode of said first transistor, and said second driving means includes a bias circuit producing and supplying said constant voltage to a control electrode of said second transistor.

5. A clamping circuit for clamping an input voltage signal to a clamp voltage during an activated state thereof, said clamping circuit comprising:

an output terminal;

first means for transferring said input voltage signal to said output terminal;

a clamp voltage terminal supplied with said clamp voltage;

a first transistor coupled between said output terminal and a first power supply line;

a differential amplifier coupled to said output terminal and said clamp voltage terminal and producing an output current responsive to a difference between a voltage at said input terminal and said clamp voltage during said activated state;

second means responsive to said output current for driving said first transistor;

a second transistor coupled between said output terminal and a second power supply line; and third means for driving said second transistor with a constant voltage during said activated state.

6. The clamping circuit as claimed in claim 5, wherein said first means comprises a capacitor.

7. The clamping circuit as claimed in claim 5 wherein said second means includes a third transistor cooperating with said first transistor to constitute a current mirror circuit to cause said first transistor to flow a current responsive to said output current.

8. The clamping circuit as claimed in claim 7, wherein each of said first and third transistors is of a first conductivity type and said second transistor is of a second conductivity type.

9. The claiming circuit as claimed in claim 5, further comprising a fourth transistor coupled between said differential amplifier and said second power supply line and supplying an operating current to said differential amplifier during said activated state.

10. The clamping circuit as claimed in claim 9, wherein said activated state is set by a clamp control signal, and each of said second and fourth transistors is supplied at a control electrode thereof with a constant voltage when said clamp control signal is applied thereto.

* * * * *